United States Patent [19]
Werrbach

[11] Patent Number: 6,160,448
[45] Date of Patent: Dec. 12, 2000

[54] DIGITALLY-CONTROLLED LOW NOISE VARIABLE-GAIN AMPLIFIER

[75] Inventor: Donn Werrbach, Glendale, Calif.

[73] Assignee: Aphex Systems, Sun Valley, Calif.

[21] Appl. No.: 09/351,434

[22] Filed: Jul. 12, 1999

[51] Int. Cl.[7] .................................................. H03F 3/68
[52] U.S. Cl. ...................... 330/124 R; 254/278; 381/109
[58] Field of Search .................... 330/254, 278, 330/279, 124 R, 295; 381/104–109, 120

[56] References Cited

U.S. PATENT DOCUMENTS

| | | | |
|---|---|---|---|
| 3,813,609 | 5/1974 | Wilkes et al. | 330/51 |
| 3,911,372 | 10/1975 | Seidel | 330/254 |
| 4,155,047 | 5/1979 | Rubens et al. | 330/254 |
| 4,989,074 | 1/1991 | Matsumoto | 358/21 R |
| 5,313,172 | 5/1994 | Vagher | 330/254 |
| 5,523,721 | 6/1996 | Segawa et al. | 330/86 |
| 5,677,962 | 10/1997 | Harrison et al. | 381/109 |

*Primary Examiner*—Michael B Shingleton
*Attorney, Agent, or Firm*—Jenkens & Gilchrist, A Professional Corporation

[57] ABSTRACT

A digitally-controlled variable-gain amplifier is disclosed, which comprises a polarization means to transform the input signal into differential signals of positive and negative polarity; first and second gain blocks, each composed of dual-multiplying digital-to-analog converters, which multiply the polarized signals to produce positive and negative amplified signals; and a differential amplification means which receives the amplified signals, and subtracts them from each other. The resulting output signal is proportional to the input signal and yields a 3 dB improvement in signal-to-noise ratio over a single multiplying digital-to-analog converter stage. A plurality of amplification chains, each comprising a first and second gain block, may be used to amplify the differential signals for summing by the differential amplification means to provide a greater signal-to-noise ratio improvement.

25 Claims, 2 Drawing Sheets

DIGITALLY-CONTROLLED LOW NOISE VARIABLE-GAIN AMPLIFIER

BACKGROUND OF THE INVENTION

1. Technical Field

The present invention relates to the field of digital control over analog signals. More specifically, the present invention relates to the field of analog amplifiers, such as those used for microphone preamplifiers, that have digitally-controlled gain.

2. History of Related Art

Past generations of microphone preamplifiers have used switched resistances to set the circuit gain by digital control. A computer or other digitally-based controller is normally used to access relays for switching the circuit's gain determining resistances. With such a method, small increments of gain control for smooth circuit gain adjustment are impractical to achieve. Therefore, relatively large steps in gain adjustment are provided for commonly available amplifiers. However, microphone preamplifiers usually require much more subtle and smooth gain control. It would therefore be useful and desirable to provide a digitally-controlled analog gain stage that allows relatively small gain increment adjustments for such uses.

In recent years, digitally-controlled analog electronic gain elements including digital potentiometers, digitally controlled amplifiers or attenuators, and Multiplying Digital-to-Analog Converters (hereinafter "MDACs") have become available. Such elements are widely used in a variety of industrial and consumer electronics equipment, but are too noisy in terms of both digital and thermal noise for use in low-noise microphone preamplifier applications. It therefore would be useful and beneficial to provide a digitally-controlled low-noise variable-gain amplifier that is suitable for use as a microphone preamplifier or in other low noise analog signal applications.

SUMMARY OF THE INVENTION

The present invention is a Digitally-Controlled Low Noise Amplifier (hereinafter referred to as "DCLNA") suitable for use with a low-noise microphone preamplifier or in other low-noise analog signal applications. The DCLNA grew out of the need for constructing a digitally-controlled microphone preamplifier of studio quality with computerized remote control capabilities. The preamplifier needed to have smooth, perceptibly stepless, digitally-controlled gain from zero to 45 dB with an equivalent input noise of less than −127 dBu. It was found that if gain steps could be made in fractional dB steps, i.e., 0.5 dB or less, then the perception of steps would be lost and gain control adjustments would appear to be smooth and continuous. A computer analysis of noise models verified that, out of the range of digitally-controlled gain circuits that are available, the MDAC comes closest to meeting the requirements for digital control of analog gain, low noise, and the ability to provide small gain increments. However, when used in conventional circuit designs, all available MDACs were still too noisy to meet the low noise requirements. The present invention provides a way to overcome much of the noise generated by conventional MDACs.

The DCLNA of the present invention has the advantage of providing a digitally-controlled variable-gain amplifier that has relatively low noise characteristics. Another advantage of the present invention is that it provides a digitally-controlled variable-gain amplifier for which the gain can be controlled in relatively small increments. Yet another advantage of the present invention is that it provides a DCLNA that is relatively free of digital control noise, as transferred to the input and output signals.

Briefly described, the DCLNA employs two sequential stages of amplification, each comprising two or more MDACs operated in a differential amplifying mode to provide a variable-gain capability from about 0 dB to more than about 40 dB in fractional dB gain steps. Improved noise performance is achieved by using parallel MDACs in the differential mode causing the correlated signal to be amplified at a higher gain than the uncorrelated noise that is generated by noise resistance within the MDACs themselves. Further, the differential amplification mode of the present invention DCLNA greatly reduces digital control noise that may be generated within the MDAC. Multiple sets of sequential stages may be summed into a differencing means for increased noise reduction.

The DCLNA of the present invention results from a novel and unique application of conventional MDACs that acts to expand the dynamic range of a single MDAC amplifier stage. More specifically, the present invention may comprise a combination of the following:

1. a received signal input polarization means to produce positive and negative polarity signals from the input signal;
2. successively connected differential gain blocks to increase the frequency bandwidth of the DCLNA at all selected gains;
3. MDACs in a digitally-controlled variable-gain amplifier topology having a gain expression inversely proportional to the digital word value; and
4. a differential amplification means to reject most of the digital charge-injection noise of the individual MDACs, and enhance the thermal noise signal-to-noise ratio of the DCLNA by a factor of about 3 dB.

Further novel features and other advantages of the present invention DCLNA will become apparent from the following detailed description, discussion, and the appended claims taken in conjunction with the drawings.

DETAILED DESCRIPTION OF THE INVENTION

Figure 1:
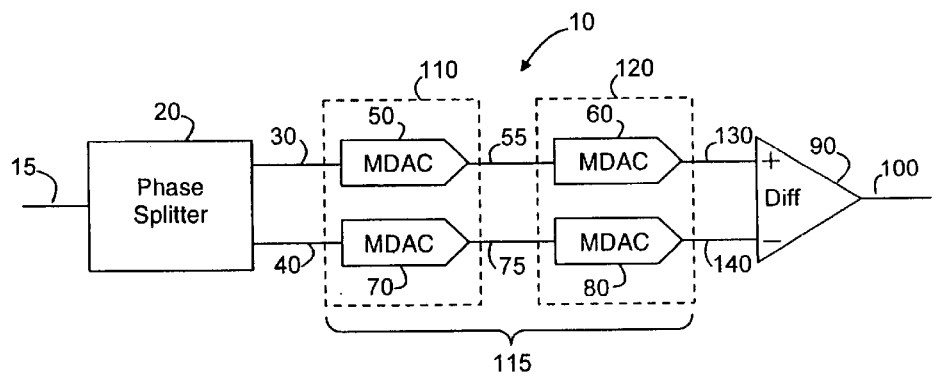
FIG. 1 is a block diagram of the present invention.

FIG. 1 is block diagram of one embodiment of the DCLNA 10 of the present invention. A polarization means, or phase splitter, 20 having a signal input 15 is adapted to transform an input signal received at the signal input 15 into two corresponding differential (opposite polarity) output signals, such as the positive polarity signal 30 and the negative polarity signal 40. These differential signals 30 and 40 pass through two sequential differential gain blocks, or a differential MDAC chain 115, formed by a first gain block 110 and a second gain block 120. Each gain block 110 and 120 is able to assert digital control over the gain applied to each of the differential signals.

The first differential gain block 110 comprises two MDACs 50 and 70 which are normally controlled by a single digital control source to produce a pre-determined amount of gain. However, MDAC 50 may be controlled by a digital control source or input control signal to produce a first pre-determined amount of gain, and MDAC 70 may be controlled by a second digital control source, or a second input control signal to provide a second pre-determined amount of gain.

The multiplication coefficient, or first and second pre-determined amounts of gain (which are normally equal), is digitally set by a single input control signal so that the transition from one value of gain to another occurs simultaneously and MDAC 50 applies the same amount of gain to the positive polarity signal as MDAC 70 applies to the negative polarity signal. In other words, typical operation of the first gain block 110 involves setting the value of the input control signal to a fixed binary code value which is equal for MDAC 50 and MDAC 70.

The positive and negative polarity signals 30 and 40 are coupled to their respective MDAC inputs and transferred to their respective MDAC outputs as analog signals, namely, a first positive amplified signal 55 and a first negative amplified signal 75, which have been multiplied in magnitude in proportion to the digital multiplier coefficient (predetermined gain amount) for the MDAC by which it was received.

The second differential gain block 120 comprises MDACs 60 and 80, and operates in an identical fashion to that described for differential gain block 110. Thus, the differential output signals from gain block 110 are coupled to the reference inputs of differential gain block 120. Just as has been described for gain block 110, the digital multiplier coefficient for MDAC 60 and MDAC 80 of gain block 120 are normally equal and controlled simultaneously, receiving the same digital code binary value so that the multiplying coefficients are changed simultaneously, and are always at the same value. However, the amount of amplification available from MDAC 60 may be separately controlled from that of MDAC 80, so that a third pre-determined amount of gain may be applied to the signal which passes through MDAC 60, and a fourth pre-determined amount of gain may be applied to the signal which passes through MDAC 80.

Thus, the first gain block 110 is adapted to receive and amplify the positive polarity signal 30 with a first pre-determined amount of gain so as to produce a first positive amplified signal 55, and the first gain block 110 is also adapted to receive and amplify the negative polarity signal 40 with a second pre-determined amount of gain so as to produce a first negative amplified signal 75. Similarly, the second gain block 120 has been adapted to receive and amplify the first positive amplified signal 55 with a third pre-determined amount of gain so as to produce a second positive amplified signal 130, and the second gain block 120 has also been adapted to receive and amplify the first negative amplified signal 75 with a fourth pre-determined amount of gain so as to produce a second negative amplified signal 140.

The second negative amplified signal 140 is subtracted from the second positive amplified signal 130 by the differential amplification means, or differential amplifier 90, which has been adapted to receive the second positive and negative amplified signals 130 and 140 to generate the output signal 100, which is in turn proportional to the input signal received at the signal input 15 according to a pre-determined amplification factor which in turn depends upon the first, second, third, and fourth pre-determined amounts of gain. The differential MDAC chain 115 provides the advantage of yielding a 3 dB signal-to-noise improvement for the chain 115 over the signal-to-noise ratio of the individual MDACs. This is because the uncorrelated noise of MDACs 50, 60, 70, and 80 are added together by the differential amplifier 90. The correlated positive and negative (differential) signals arriving at the differential amplifier 90 (i.e., second positive and negative amplified signals 130 and 140) yield a root-mean-square sum of 6 dB, while the uncorrelated thermal noise added by the positive and negative signals throughout the MDAC gain stages yield a root-mean-square sum of only 3 dB. Thus, a net 3 dB signal-to-noise improvement is achieved by using the MDAC chain 115 of the present invention, instead of a more conventional amplification approach (e.g. simple MDACS in series, with no differential amplification).

Another advantage accrues when the digital multiplier coefficient of the MDACs of each gain block (i.e., MDACs 50 and 70, and MDACs 60 and 80) are data switched in paired unison so that the multiplier data code changes for both MDACs in a gain block occur at the same instant. This arrangement results in the first predetermined amount of gain being approximately equal to the second predetermined amount of gain, and the third predetermined amount of gain being approximately equal to the fourth predetermined amount of gain. In these circumstances, the output signal 100 amplitude is proportional to the product of the values of the first and third predetermined amounts of gain. The charge-injected output noise of both MDACs is approximately equal, and thereby represents mostly common mode noise relative to the differential signal input of the differential amplifier 90. Thus, most of the charge-injection noise of all the MDACs is rejected by the differential amplifier 90, and will not be passed on as a part of the output signal 100.

Figure 2:
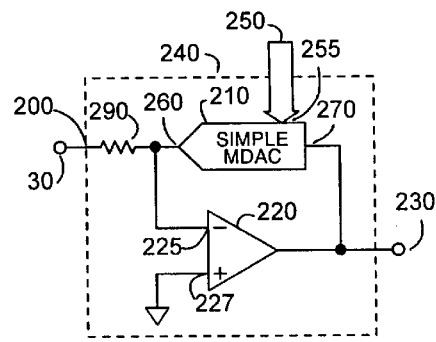
FIG. 2 illustrates a single MDAC variable-gain stage.

FIG. 2 illustrates a single MDAC variable-gain stage 240 of the present invention, which is similar to, or identical to, MDACs 50, 60, 70, and 80 shown in FIG. 1. Simple MDAC 210 is a conventional current-output, multiplying, digital-to-analog converter which comprises a digital input 255, a bipolar analog reference input 270, a current output 260, and an internal fixed resistance 290 coupled to the current output 260. Such simple MDACs 210 are readily available from many sources and their typical application circuits are taught in the respective manufacturer's data books, as is well known in the art.

It can be seen from FIG. 2 that the simple MDAC 210 is used to create a variable feedback loop for an operational amplifier (opamp) 220, thus establishing a variable-gain amplifier stage 240 having possible gains from unity to the maximum value of the digital control word. As an example only, and not to limit the present invention, the maximum possible gain of the illustrated circuit using an 8-bit simple MDAC 210 would be $2^8$, or 256, which equals 48 dB.

An analog input signal, such as the positive polarity signal 30, is coupled to, and received by, the second end of input resistor 290 at the stage input 200. This resistor 290 may be discrete, or comprise the "feedback" resistor contained within most conventional simple MDACs 210 as part of a single monolithic circuit. An input control signal 250, in the form of suitable binary digital data is coupled to the digital input 255 to control the multiplier coefficient of the simple MDAC 210. The current output 260 of the MDAC 210 is coupled to the inverting input 225 of the opamp 220 and the first end of the resistor 290. The output 230 of the opamp 220 is coupled to the voltage reference input 270 of the simple MDAC 210. The current output 260 of the simple MDAC 210 is proportional to the product of the digital input control signal 250, or multiplier coefficient, received at the digital input 255, and the input control voltage received at the reference input 270. The voltage gain of this stage 240 is thus a function of the multiplier coefficient of the simple MDAC 210 and is lowest when the multiplier coefficient is maximum (full scale). For example, if an 8-bit simple MDAC 210 is used, the lowest gain available is unity. That occurs at a digital multiplier code value of 11111111, where the maximum feedback signal is supplied to the opamp 220. Maximum gain occurs at a code value of 00000001, where the feedback is 1/256 of the maximum available. If a code value of 00000000 is used, the simple MDAC 210 output 260 is set to zero, the opamp 220 receives no feedback, and the gain stage 240 goes open loop and becomes unstable. Thus, use of an all-zero binary code value is usually to be avoided.

Two sequential differential gain blocks (110 and 120) are used in the present invention, instead of placing all of the circuit gain in a single block, so as to obtain greater bandwidth at high levels of gain. The useful gain obtained by using the circuit of FIG. 2 alone is limited, since frequency bandwidth varies as a function of the stage 240 gain. This is due to the distributed capacitance within the simple MDAC 210 structure, which provides significant feedback capacitance to the opamp 220. As the MDAC multiplier coefficient 250 is made smaller, the stage 240 gain increases. The effect of reducing the multiplier coefficient 250 is to raise the opamp 220 effective feedback resistance to approximate the product of the input resistor 290 resistance value and the stage 240 gain. Typically, the value of the resistor 290 will be about 5000 to about 30,000 Ohms. At a stage 240 gain of 45 dB, the effective feedback resistance is raised to a value of about 900 kilohms to about 5 megohms. At these high values of resistance, the −3 dB bandwidth of he stage 240 falls to about 2 kHz (for the component values listed in Table 1), which renders the stage 240 useless as a high quality microphone preamplifier (a 20 kHz bandwidth is desired). However, obtaining 45 dB of gain using two gain blocks formed from multiple stages as shown in FIG. 1, in the form of chain 115, each providing a part of the net gain, preserves an adequate bandwidth at all the required gain settings (approximately 40 kHz to 70 kHz bandwidth using the component values listed in Table 1).

Figure 3:
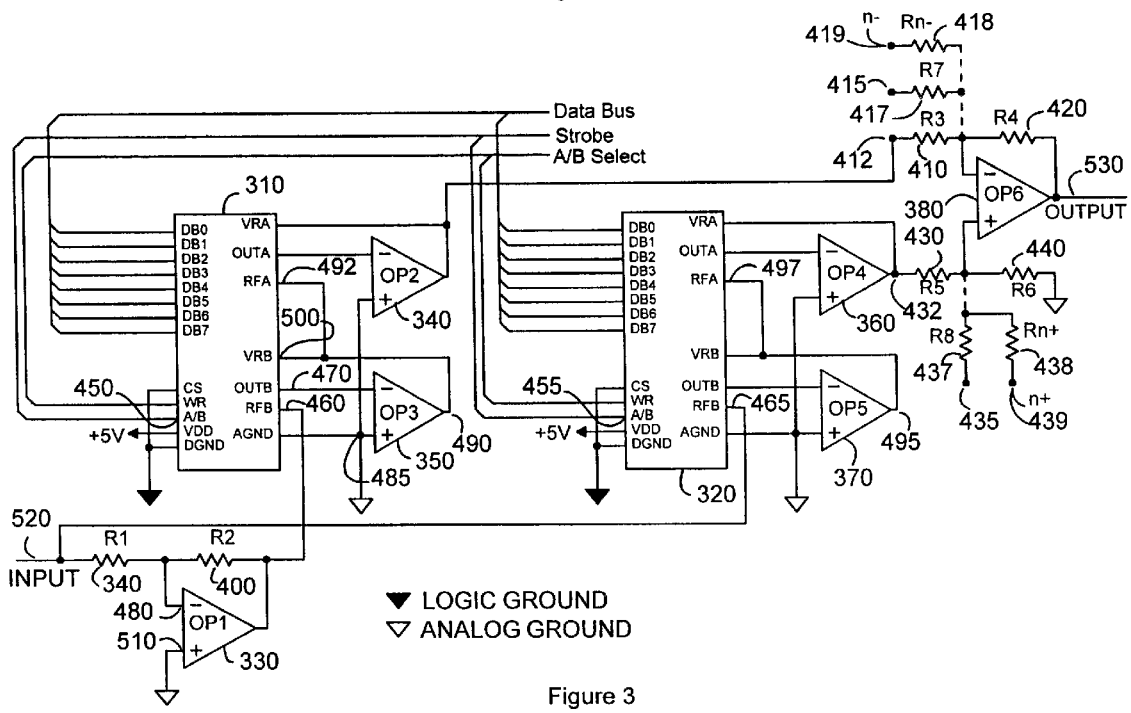
FIG. 3 is a detailed schematic diagram of the preferred embodiment.

Referring to FIG. 3, a schematic diagram of the preferred embodiment, there are shown two dual-MDACs, 310 and 320, each of which comprise an MDAC "A" and an MDAC "B" sharing a common data bus, but separately enabled for data input by an A/B select pin 450 and 455. For the purpose of discussing relative circuit performance, and to enable the practice of the invention, several specific component values are shown in Table 1. While actual circuit values and configurations may be identical to those illustrated herein, they may also be similar to those shown, as is well-known by those skilled in the art, and are not meant to limit the invention in any way.

TABLE 1

| Component Number | Generic Name | Value | Manufacturer's Part Number |
| --- | --- | --- | --- |
| 310, 320 | Dual MDAC | N/A | Analog Devices AD7528 |
| 330, 340, 350, 360, 370, 380 | Operational Amplifier | N/A | NEC NE5532 |
| 390, 400, 410, 417, 420, 430, 437, 440 | Resistor | 3,320 Ohms, 1% | Panasonic ERJ-8ENF3.32K |

Dual-MDACs 310 and 320, and associated opamps 340 through 370 are each configured as two separate gain blocks comprising MDAC gain stages which are similar to, or identical to the gain stage 240 shown in FIG. 2. Since all the MDAC gain blocks (each comprising two gain stages) are constructed in the same manner, only one gain block will be described.

MDAC "B" of dual-MDAC 310 is associated with opamp 350. The MDAC "B" input 460 (equivalent to input 200 of FIG. 2) is coupled to the MDAC "B" internal resistor (not shown, but illustrated as resistor 290 of FIG. 2). The MDAC current output 470 (shown as output 260 of FIG. 2) is coupled to the opamp 350 inverting input 480. The voltage output 490 of opamp 350 is coupled to the MDAC reference input 500 (shown as input 270 of FIG. 2) of dual-MDAC 310. The non-inverting input 485 of the opamp 350 (shown as noninverting input 227 in FIG. 2) is coupled to analog ground or some other reference voltage. The MDAC "B" stage output (shown as output 230 of FIG. 2) appears at the output of opamp 490.

One skilled in the art can readily apply the preceding description to MDAC "A" of dual-MDAC 310 in combination with opamp 340, and further, to the two MDACs (i.e., "A" and "B") of dual-MDAC 320 in combination with opamps 360 and 370, respectively.

The four MDACs (i.e., "A" and "B" of dual-MDACs 310 and 320) each are configured similarly to, or identically to, gain stage 240 of FIG. 2 and perform together as illustrated in FIG. 1. The MDACs 60 and 80 of FIG. 1 are similar to, or identical to, MDACs "A" of dual-MDACs 320 and 310, and the MDACs 50 and 70 of FIG. 1 are similar to, or identical to MDACs "B" of dual-MDACs 320 and 310. It can easily be seen, therefore, that the "B" MDACs of dual-MDACs 310 and 320, taken together, conform to the first gain block 110 of FIG. 1, and that the "A" MDACs of dual-MDACs 310 and 320 correspond to the second gain block 120 of FIG. 1.

Further, the input signal 520 corresponds to the positive polarity signal 30 of FIG. 1, and the output of the differential amplifier 330 at input 460, corresponds to the negative polarity signal 40 out of the phase splitter 20 of FIG. 1. This provides two identical signals of opposite polarity that are equivalent to the differential signals 30 and 40 of FIG. 1. The positive polarity signal (shown as signal 30 in FIG. 1) is coupled to the input 465 of MDAC "B" of dual-MDAC 320. The negative signal (shown as 40 of FIG. 1) is coupled to the input 460 of MDAC "B" of dual-MDAC 310. This arrangement allows the A/B select lines 450 and 455 to enable the "B" MDACs of dual-MDACs 310 and 320 to be programmed together at the same instant for the purpose of reducing charge injection noise whenever the gain is changed as previously described.

The stage output 495 of MDAC "B" of dual-MDAC 320 is coupled to the input 497 of MDAC "A" of dual-MDAC 320. The stage output 490 of MDAC "B" of dual-MDAC 310 is likewise coupled to the input 492 of MDAC "A" of dual-MDAC 310. Both "A" MDACs of dual-MDACs 310 and 320 are also be connected together to change stage gain at the same instant by way of the A/B select lines 450 and 455 for the purpose of reducing charge injection noise whenever the gain is changed.

The outputs of opamps 360 and 340 produce the second positive and negative amplified signals 130 and 140, respectively, of FIG. 1. The differential amplifier circuit of opamp 380 corresponds to the differential amplifier 90 of FIG. 1. The coupling of the MDAC "A" stage outputs of dual-MDACs 310 and 320 to the differential amplifier of opamp 380 inputs by way of resistors 410 and 430 corresponds to similar connections shown in FIG. 1, using the second negative and positive amplified signals 130 and 140. Additional summing inputs for the differential amplification means 90, such as optional positive and negative summing inputs 435 and 415, may be used for expanded DCLNA configurations, as will be discussed with respect to FIG. 4. Finally, the output 530 of opamp 380 corresponds to the output 100 of FIG. 1.

Many enhancements may be added to the circuit of FIG. 3 without exceeding the scope of the present invention. For example, it is anticipated that direct current offset trims may be added to one or more of the opamps 330–380 to reduce direct current drift at the output 530. It is also anticipated that feedback capacitors may be added to better stabilize the opamps 330–380 against oscillation, as is well known in the art. The use of simple MDACs made by other manufacturers, or having varying individual performance characteristics may require different circuit biasing arrangements. These kinds of variations should be considered well known in the art and within the scope and contemplation of the present invention.

Figure 4:
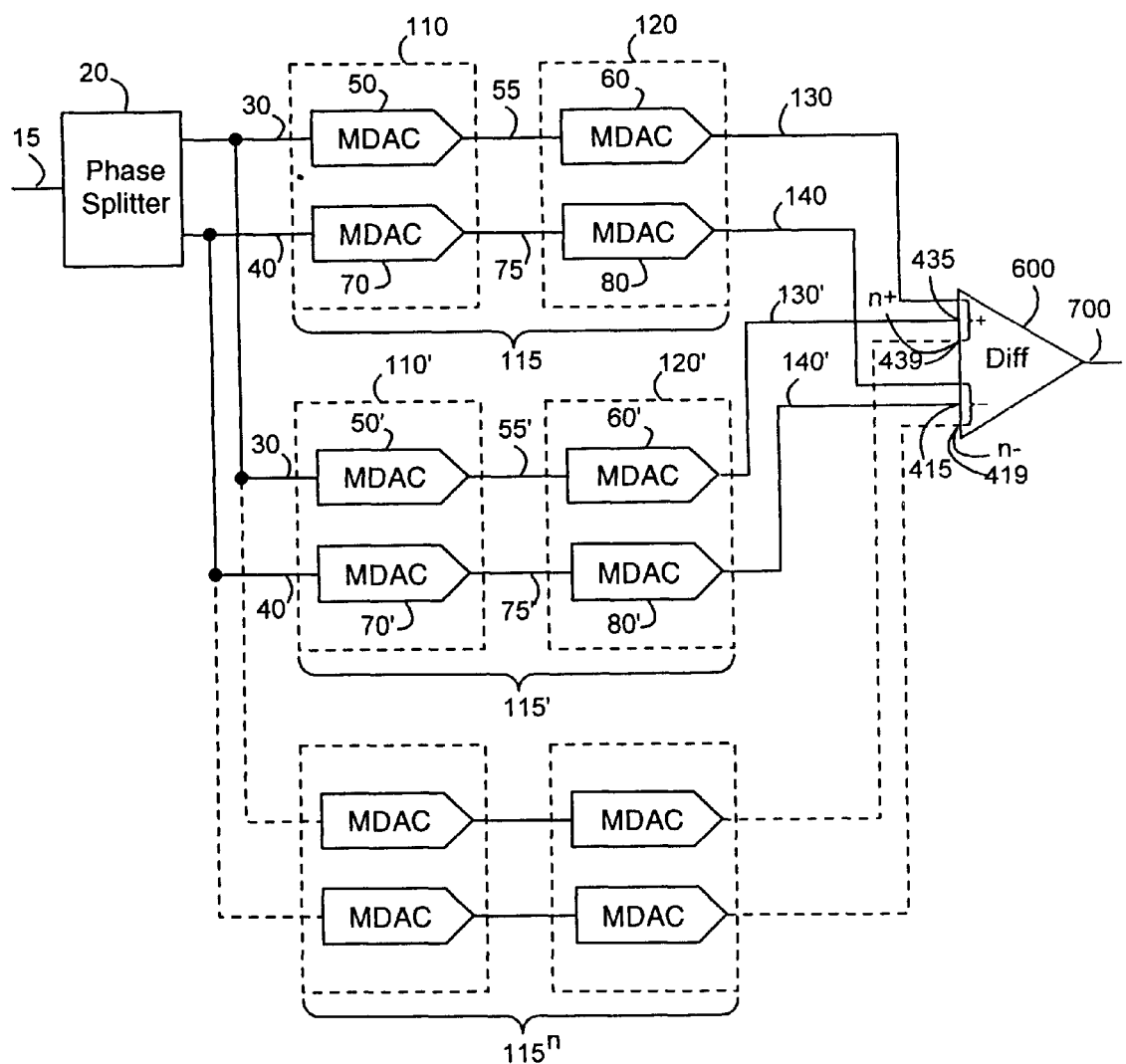
FIG. 4 is a block diagram of an expanded embodiment of the present invention.

A further improvement in the low noise characteristics of the amplifier may be made by implementing the expanded construction illustrated in FIG. 4, wherein a block diagram similar to that of FIG. 1 is shown, but with additional gain block stages of amplification forming a second differential MDAC chain 115', additional MDAC chain 115n, and a differential amplification means 600. The differential MDAC chain 115 operates as described above.

In this case, the polarization means, or phase splitter 20 provides differential signals 30 and 40, which pass through additional sequential differential gain blocks, such as the differential MDAC chain 115', formed by a third gain block 110' and a fourth gain block 120'. Each gain block 110' and 120' is adapted to receive digital control over the gain applied to each of the differential signals it amplifies.

The third differential gain block 110' comprises two MDACs 50' and 70' which are normally controlled by a single digital control source to provide a first pre-determined amount of gain, which for best performance is approximately equal to that used to control the two MDACs 50 and 70. However, MDAC 50' may also be controlled by a separate digital control source or input control signal, as may MDAC 70'.

The multiplication coefficient, or first pre-determined amount of gain is preferably set by a single digital control source, so that the transition from one value of gain to another occurs simultaneously, and MDACs 50, 50' apply the same amount of gain to the positive polarity signal 30 as MDACs 70, 70' apply to the negative polarity signal 40. In other words, typical operation of the first and third gain blocks 110 and 110' involves setting the gain input control signal to a fixed binary code value which is equal for MDACs 50 and 50' and MDACs 70 and 70'.

Just as the positive and negative polarity signals 30 and 40 are coupled to their respective MDAC inputs and transferred to their respective MDAC outputs as analog signals, namely, as a first positive amplified signal 55 and a first negative amplified signal 75, which have been multiplied in magnitude in proportion to the digital multiplier coefficient (predetermined gain amounts) for the MDAC by which it was received, the positive and negative polarity signals 30 and 40 are also coupled to the respective MDAC inputs and transferred to the respective MDAC outputs of the third gain block 110' as analog signals, namely, as a third positive amplified signal 55' and a third negative amplified signal 75', which have been multiplied in magnitude in proportion to the digital multiplier coefficient (predetermined gain amounts) for the MDAC by which it was received.

The fourth differential gain block 120' likewise comprises MDACs 60' and 80', and operates in an identical fashion to that described for the differential gain block 110'. Thus, the differential output signals from the gain block 110' are coupled to the reference inputs of the differential gain block 120'. The digital multiplier coefficient for MDACs 60 and 60' and MDACs 80 and 80' of gain block 120' are typically equal and controlled simultaneously for best amplifier performance, using the same digital code binary value so that the gain multiplying coefficients are changed simultaneously, and are always at the same value. However, the amount of amplification available from MDAC 60' may also be separately controlled from that of MDAC 80', so that a pre-determined amount of gain may be applied to the signal which passes through MDAC 60', and a different pre-determined amount of gain may be applied to the signal which passes through MDAC 80'.

Thus, the second gain block 120' has been adapted to receive and amplify the third positive amplified signal 55' with a pre-determined amount of gain so as to produce a fourth positive amplified signal 130', and the second gain block 120' has also been adapted to receive and amplify the third negative amplified signal 75' with a pre-determined amount of gain so as to produce a fourth negative amplified signal 140'.

The second and fourth positive amplified signals 130 and 130' are summed together at the differential amplification means, or difference amplifier 600 (by connection to the input ends 412 and 415 of the resistors 410 and 417 shown in FIG. 3), as are the second and fourth negative amplified signals 140 and 140' (by connection to input ends 432 and 435 of the resistors 430, 437 shown in FIG. 3). The resistor ends 415, 419, 435, and 439 are shown unconnected in FIG. 3, since this figure is used to depict one possible circuit topology which embodies the invention shown in FIG. 1. However, when a plurality (i.e. "n" chains 115) of differential MDAC chains are to be summed into the differential amplification means 600, as shown in FIG. 4, then additional summing inputs such as 415, 419, 435, 439, etc. may be expanded to any number of terminals as needed, and are connected as shown in FIG. 4. In essence, the differential amplification means 600 may be adapted to receive and sum the resulting plurality of second positive amplified signals, and to receive and sum the resulting plurality of second negative amplified signals, and to subtract the summed second negative amplified signals from the summed second positive amplified signals to produce an output signal 700 proportional to the input signal 15.

Considering only the dual-chain inventive embodiment comprising chains 115 and 115', the sum of the signals 140 and 140' is then subtracted from the sum of the signals 130 and 130' by the difference amplifier 600 to produce the output signal 700, which is proportional to the input signal 15.

The concept of parallel expansion can be carried out even further, although diminishing returns are rapidly approached. Differential MDAC chain 115, used in isolation, provides a 3 dB reduction in the amplifier noise floor, as described above. Every time the number of differential MDAC chains is doubled, and the outputs are summed into the differential amplification means 600, an additional improvement of about 3 db can be made (e.g. using the dual-chain embodiment comprising chains 115 and 115' gives about 6 db, but using four chains having sixteen simple MDACs, not shown, gives about a 9 db improvement). Of course, the number of simple MDACS (e.g. 50, 60, etc.) will also be doubled, increasing the power and physical space required by the circuit. It should be noted that when a plurality of chains 115" are desired, additional differential MDAC chains 115" do not have to be added in an exponential manner; any number of additional chains 115" will continue to improve the noise floor value, but using less than double the previous amount of chains 115" will give somewhat less than a 3 db improvement. As illustrated in FIG. 4, the three MDAC chains 115, 115', and 115n will provide a noise floor which is improved by an amount between about 6 db and 9 db.

Although the invention has been described with reference to specific embodiments, this description is not meant to be construed in a limited sense. The various modifications of the disclosed embodiments, as well as alternative embodiments of the invention will become apparent to persons skilled in the art upon reference to the description of the invention. It is, therefore, contemplated that the appended claims will cover such modifications that fall within the scope of the invention, or their equivalence.

What is claimed is:

1. An amplifier having an improved thermal noise signal-to-noise ratio over amplifiers employing a single multiplying digital-to-analog converter and constructed to reject digital charge injection noise, comprising:

a polarization means having a signal input and adapted to transform an input signal received at the signal input into a positive polarity signal and a negative polarity signal;

a first gain block in electrical communication with the polarization means, the first gain block being adapted to receive and amplify the positive polarity signal with a first predetermined amount of gain so as to produce a first positive amplified signal, and being adapted to receive and amplify the negative polarity signal with a second predetermined amount of gain so as to produce a first negative amplified signal, wherein the first and second predetermined amounts of gain are approximately equal;

a second gain block in electrical communication with the first gain block, the second gain block being adapted to receive and amplify the first positive amplified signal with a third predetermined amount of gain so as to produce a second positive amplified signal, and being adapted to receive and amplify the first negative amplified signal with a fourth predetermined amount of gain so as to produce a second negative amplified signal, wherein the third and fourth predetermined amounts of gain are approximately equal; and a differential amplification means in electronic communication with the second gain block, the differential amplification means being adapted to receive the second positive amplified signal and the second negative amplified signal, and to subtract the second negative amplified signal from the second positive amplified signal to produce an output signal proportional to the input signal.

2. The amplifier of claim 1, wherein the output signal is proportional to the product of the first and third predetermined amounts of gain.

3. The amplifier of claim 1, wherein the first predetermined amount of gain is inversely proportional to an input control signal comprising binary digital data.

4. The amplifier of claim 1, wherein the polarization means comprises an operational amplifier.

5. The amplifier of claim 1, wherein the first and second gain blocks each comprise at least two multiplying digital-to-analog converters.

6. The amplifier of claim 1, wherein the differential amplification means comprises an operational amplifier.

7. A digitally-controlled variable-gain amplifier, comprising:

a polarization means having a signal input and adapted to transform an input signal received at the signal input into to a positive polarity signal and a negative polarity signal;

a first gain block in electrical communication with the polarization means, the first gain block being adapted to receive and amplify the positive polarity signal with a first predetermined amount of gain so as to produce a first positive amplified signal, and being adapted to receive and amplify the negative polarity signal with a second predetermined amount of gain so as to produce a first negative amplified signal;

a second gain block in electrical communication with the first gain block, the second gain block being adapted to receive and amplify the first positive amplified signal with a third predetermined amount of gain so as to produce a second positive amplified signal, and being adapted to receive and amplify the first negative amplified signal with a fourth predetermined amount of gain so as to produce a second negative amplified signal; and a differential amplification means in electronic communication with the second gain block, the differential amplification means being adapted to receive the second positive amplified signal and the second negative amplified signal, and to add the second positive amplified signal to the second negative amplified signal to produce an output signal proportional to the input signal.

8. The digitally-controlled variable-gain amplifier of claim 7, wherein the output signal is proportional to the input signal according to a predetermined amplification factor.

9. The digitally-controlled variable-gain amplifier of claim 7, wherein the polarization means comprises a phase splitter.

10. The digitally-controlled variable-gain amplifier of claim 7, wherein the polarization means comprises an operational amplifier.

11. The digitally-controlled variable-gain amplifier of claim 7, wherein the first and second gain blocks each comprise at least two multiplying digital to analog converters.

12. The digitally-controlled variable-gain amplifier of claim 7, wherein the differential amplification means comprises an operational amplifier.

13. The digitally-controlled variable-gain amplifier of claim 7, wherein the first gain block comprises:

a multiplying digital to analog converter having a digital input, a reference input, and an analog current output proportional to the product of an input control signal received by the digital input, and an input control voltage received by the reference input;

an input resistor having a first end and a second end, the first end being electrically connected to the analog current output so as to produce a multiplied voltage at the second end; and an operational amplifier having an inverting input electrically connected to the second end of the input resistor so as to receive the multiplied voltage, a noninverting input electrically connected to a reference voltage, and an amplified output electrically connected to the reference input.

14. The digitally-controlled variable-gain amplifier of claim 13, wherein the multiplying digital to analog converter and the input resistor are formed as part of a single monolithic circuit.

15. The digitally-controlled variable-gain amplifier of claim 7, wherein the second gain block comprises:

a multiplying digital to analog converter having a digital input, a reference input, and an analog current output proportional to the product of an input control signal received by the digital input, and an input control voltage received by the reference input;

an input resistor having a first end and a second end, the first end being electrically connected to the analog current output so as to produce a multiplied voltage at the second end; and an operational amplifier having an inverting input electrically connected to the second end of the input resistor so as to receive the multiplied voltage, a noninverting input electrically connected to a reference voltage, and an amplified output electrically connected to the reference input.

16. The digitally-controlled variable-gain amplifier of claim 15, wherein the multiplying digital to analog converter and the input resistor are formed as part of a single monolithic circuit.

17. A digitally-controlled variable-gain amplifier, comprising:

a polarization means having a signal input and adapted to transform an input signal received at the signal input into a positive polarity signal and a negative polarity signal;

a first gain block in electrical communication with the polarization means, the first gain block being adapted to receive and amplify the positive and negative polarity signals with a first predetermined amount of gain so as to produce a first positive amplified signal and a first negative amplified signal;

a second gain block in electrical communication with the first gain block, the second gain block being adapted to receive and amplify the first positive and negative amplified signals with a third predetermined amount of gain so as to produce a second positive amplified signal and a second negative amplified signal; and a differential amplification means in electronic communication with the second gain block, the differential amplification means being adapted to receive the second positive and negative amplified signals and subtract the second negative amplified signal from the second positive amplified signal to produce an output signal proportional to the input signal.

18. The digitally-controlled variable-gain amplifier of claim 17, wherein the output signal is proportional to the input signal according to a predetermined amplification factor.

19. The digitally-controlled variable-gain amplifier of claim 18, wherein the predetermined amplification factor is proportional to the product of the first and third predetermined amounts of gain.

20. The digitally-controlled variable-gain amplifier of claim 17, wherein the first and third predetermined amounts of gain are proportional to an input control signal comprising binary digital data.

21. The digitally-controlled variable-gain amplifier of claim 17, further comprising:

a third gain block in electrical communication with the polarization means, the third gain block being adapted to receive and amplify the positive and negative polarity signals as determined by the first predetermined amount of gain so as to produce a third positive amplified signal and a third negative amplified signal;

a fourth gain block in electrical communication with the third gain block, the fourth gain block being adapted to receive and amplify the third positive and negative amplified signals as determined by the third predetermined amount of gain so as to produce a fourth positive amplified signal and a fourth negative amplified signal, wherein the differential amplification means is in electronic communication with the second gain block and the fourth gain block, and is adapted to subtract the sum of the second and fourth negative amplified signals from the sum of the second and fourth positive amplified signals to produce an output signal proportional to the input signal.

22. A digitally-controlled variable-gain amplifier, comprising:

a polarization means having a signal input and adapted to transform an input signal received at the signal input into a positive polarity signal and a negative polarity signal;

a plurality of differential multiplying digital-to-analog converter chains, each chain comprising a first gain block in electrical communication with the polarization means, and a second gain block in electrical communication with the first gain block, the first gain block being adapted to receive and amplify the positive and negative polarity signals with a first predetermined amount of gain so as to produce a first positive amplified signal and a first negative amplified signal, and the second gain block being adapted to receive and amplify the first positive and negative amplified signals with a third predetermined amount of gain so as to produce a second positive amplified signal and a second negative amplified signal; and a differential amplification means in electronic communication with each of the second gain blocks, the differential amplification means being adapted to receive and sum the second positive amplified signals and to receive and sum the second negative amplified signals, and to subtract the summed second negative amplified signals from the summed second positive amplified signals to produce an output signal proportional to the input signal.

23. The digitally-controlled variable-gain amplifier of claim 22, wherein the output signal is proportional to the input signal according to a predetermined amplification factor.

24. The digitally-controlled variable-gain amplifier of claim 23, wherein the predetermined amplification factor is proportional to the product of the first and third predetermined amounts of gain.

25. The digitally-controlled variable-gain amplifier of claim 22, wherein the first and third predetermined amounts of gain are proportional to an input control signal comprising binary digital data.

* * * * *